(12) United States Patent
Chen et al.

(10) Patent No.: US 7,067,975 B2
(45) Date of Patent: Jun. 27, 2006

(54) FULL COLOR DISPLAY PANEL WITH MIRROR FUNCTION

(75) Inventors: Chi-Chung Chen, Taiwan (TW); Jen-yuan Chiu, Taipei (TW); Tien Rong Lu, Tainan (TW); Kuei-Hui Yang, Taipei (TW)

(73) Assignee: RiTdisplay Corporation, Hsin Chu (TW)

( * ) Notice: Subject to any disclaimer, the term of this patent is extended or adjusted under 35 U.S.C. 154(b) by 189 days.

(21) Appl. No.: 10/859,206

(22) Filed: Jun. 3, 2004

(65) Prior Publication Data

US 2004/0251824 A1 Dec. 16, 2004

(30) Foreign Application Priority Data

Jun. 10, 2003 (TW) .............................. 92115768 A

(51) Int. Cl.
*H01J 1/62* (2006.01)
(52) U.S. Cl. ........................ 313/512; 313/506
(58) Field of Classification Search ................ 313/498, 313/501, 503–506, 509, 512
See application file for complete search history.

Primary Examiner—Vip Patel
(74) *Attorney, Agent, or Firm*—Birch, Stewart, Kolasch & Birch, LLP

(57) ABSTRACT

A full color display panel with a mirror function comprises an organic light-emitting area, a spectrum-modulation layer, a color-separating layer, a transparent substrate and a semi-reflecting layer. The organic light-emitting area includes a plurality of pixels for emitting white light. The spectrum-modulation layer is doped with a fluorescent material and/or a phosphorescent material in a transparent protecting medium. The color-separating layer includes a light-shielding frame and a plurality of color filters. The light-shielding frame is disposed around the peripheral of the color filters. The transparent substrate has a first surface and a second surface opposite to the first surface. The color-separating layer is disposed above the first surface of the transparent substrate. The spectrum-modulation layer is disposed above the color-separating layer. The organic light-emitting area is disposed above the spectrum-modulation layer. The semi-reflecting layer is disposed between the first surface and color-separating layer or on the second surface.

20 Claims, 6 Drawing Sheets

FULL COLOR DISPLAY PANEL WITH MIRROR FUNCTION

This Non-provisional application claims priority under 35 U.S.C. § 119(a) on Patent Application No(s). 092115768 filed in Taiwan on Jun. 10, 2003, the entire contents of which are hereby incorporated by reference.

BACKGROUND OF THE INVENTION

1. Field of Invention

The invention relates to a full color display panel with a mirror function and, in particular, to a full color display panel with a mirror function that has a semi-reflecting layer.

2. Related Art

The colorizing technologies utilized in the present organic electroluminescent displays mainly include the following three. The first technology is "Three Primary Colors Light-emitting Method" that uses respectively three primary colors (Red, Green, and Blue) for an independent electroluminescent unit. The second technology is "Color Conversion Medium" that includes a blue light material and cooperates with a red organic fluorescent material and a green organic fluorescent material to generate various colors. The third technology is "Color Filter Method" that includes white light electroluminescent layer and color filters. Hereinafter, the color conversion medium technology is taken for an example and is described below.

Idemitsu Kosan Co. is one of the leaders in developing the color conversion medium technology. As shown in FIG. 1, a full color display panel 3 comprises an organic light-emitting area 31, a planarization layer 32, a color conversion layer 33, a glass substrate 34 and an encapsulating cap 35. The organic light-emitting area 31 is disposed on the planarization layer 32, the planarization layer 32 is disposed on the color conversion layer 33, the color conversion layer 33 is disposed on the glass substrate 34, and the encapsulating cap 35 is connected to the glass substrate 34. In this case, the organic light-emitting area 31 includes a first electrode 311, an organic functional layer 312 and the second electrode 313, which are disposed on the planarization layer 32 in sequence. The organic functional layer 312 is made of a blue light material, so that the organic light-emitting area 31 can emit blue light. The color conversion layer 33 comprises a plurality of blue filters 331, green filters 332, red filters 333, green conversion films 332', and red conversion films 333'. The green conversion films 332' and the red conversion films 333' are disposed on the green filters 332 and the red filters 333, respectively. The filters 331, 332, and 333 are respectively corresponding to the pixels of the organic light-emitting area 31.

The blue light emitted from the organic light-emitting area 31 may pass through the green conversion film 332' and red conversion film 333', and is respectively converted into green light and red light. The green light and red light converted from the blue light pass the green filter 332 and the red filter 333 respectively, to increase the contrast of the green light and the red light. At the meanwhile, the blue light emitted from the organic light-emitting area 31 also passes through the blue filter 331. Finally, a driving circuit is provided to produce the desired color screen according to the generated three primary colors (red light (R), green light (G), and blue light (B)).

In the conventional color display panel 3, however, since at least three photolithography processes are necessary to form the green conversion films 332' and the red conversion films 333' on the green filters 332 and the red filters 333, the manufacturing processes of the color display panel 3 are more complex and the cost thereof is increased. Furthermore, since the color display panel 3 includes the planarization layer 32 to make the whole panel more planar, the thickness of the whole panel 3 is also increased, which did not follow the trend toward lightweight and compact devices.

In addition, from the pragmatic point of view, the applications of the full color display panel can be further expanded if it has a reflecting mirror function. To achieve such an effect, a conventional art is to attach a reflecting film onto a surface of the display panel. Thus, the display panel renders dual functions of displaying images and reflecting images.

However, since the reflectance of the reflecting film is inversely proportional to its transmittance (i.e. the better its reflectance is, the worse its transmittance is), those display panel attached with reflecting films generally have decreased brightness. Moreover, since the reflecting film is attached onto the display panel with an adhesive, which has limited lifetime, the attached reflecting film is not ideal for long-term usages.

It is therefore a target to provide a full color display panel to solve the above-mentioned problems.

SUMMARY OF THE INVENTION

In view of the foregoing, the invention is to provide a full color display panel with a mirror function, which is without the conventional planarization layer and do not respectively utilize the color conversion films of three primary colors (R, G, B).

To achieve the above, the full color display panel with a mirror function of the invention comprises an organic light-emitting area, a spectrum-modulation layer, a color-separating layer, a transparent substrate, and a semi-reflecting layer. In this invention, the organic light-emitting area includes a plurality of pixels for emitting white light. The spectrum-modulation layer includes a protecting medium, which is transparent and is doped with a fluorescent material and/or a phosphorescent material. The color-separating layer includes a light-shielding frame and a plurality of color filters, wherein the light-shielding frame is disposed around the peripheral of the color filters. The transparent substrate has a first surface and a second surface opposite to the first surface. The color-separating layer is disposed on the first surface of the transparent substrate. The spectrum-modulation layer is disposed above the color-separating layer. The organic light-emitting area is disposed above the spectrum-modulation layer. The semi-reflecting layer is disposed on the second surface of the transparent substrate or is sandwiched between the first surface of the transparent substrate and the color-separating layer.

To achieve the above, the full color display panel with a mirror function of the invention comprises an organic light-emitting area, a spectrum-modulation layer, a color-separating layer, a transparent substrate, and a semi-reflecting layer. In this invention, the organic light-emitting area includes a plurality of pixels for emitting short wavelength light. The spectrum-modulation layer includes a protecting medium, which is transparent and is doped with a fluorescent material and/or a phosphorescent material. The color-separating layer includes a light-shielding frame and a plurality of color filters, wherein the light-shielding frame is disposed around the peripheral of the color filters. The transparent substrate has a first surface and a second surface opposite to the first surface. The color-separating layer is disposed on the first surface of the transparent substrate. The spectrum-modulation layer is disposed above the color-separating layer. The organic light-emitting area is disposed above the spectrum-modulation layer. The semi-reflecting layer is disposed on the second surface of the transparent substrate or is sandwiched between the first surface of the transparent substrate and the color-separating layer. The short wavelength light emitted from the pixels of the organic light-emitting area is ultraviolet light or blue light.

As mentioned above, the full color display panel with a mirror function of the invention has a spectrum-modulation layer, which is used to improve the purity of white light emitted from the organic light-emitting area or to translate the short wavelength ultraviolet or blue light emitted from the organic light-emitting area into white light, so as to enhance the luminescent efficiency of the organic light-emitting area. Therefore, the white light with uniform and broadband radiation spectrum can be obtained, and satisfy the application of full color displays. Comparing with the conventional art, since the planarization layer is unnecessary in the invention, the structure of the full color display panel of the invention is simplified. At the meanwhile, the thickness of the panel of the invention is reduced. In addition, since it is unnecessary to perform the photolithography processes to form the color conversion films of three primary colors (R, G, B), the manufacturing processes of the color display panel are simplified and the cost thereof is decreased. Moreover, the manufacturing yield is increased. Furthermore, since it is not to be restricted by the areas of the color conversion films, the viewing angle of the panel can be increased. In addition, the full color display panel with a mirror function of invention has a semi-reflecting layer for producing mirror effects. When the organic light-emitting area emits light, the display panel of the invention exhibits its display function. On the other hand, when the organic light-emitting area does not emit light, the display panel of the invention exhibits the mirror function. The invention integrates the semi-reflecting layer in the planar structure of the full color display panel so that the full color display panel of the invention has the dual functions of displaying and reflecting images. This does not only broaden the application scope of the full color display panel, but also makes the operations much easier for users. Since the semi-reflecting layer is disposed inside the full color display panel, the manufacturing process is simpler and cheaper. Therefore, the invention is suitable for mass production.

BRIEF DESCRIPTION OF THE DRAWINGS

The invention will become more fully understood from the detailed description given hereinbelow illustration only, and thus is not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1:
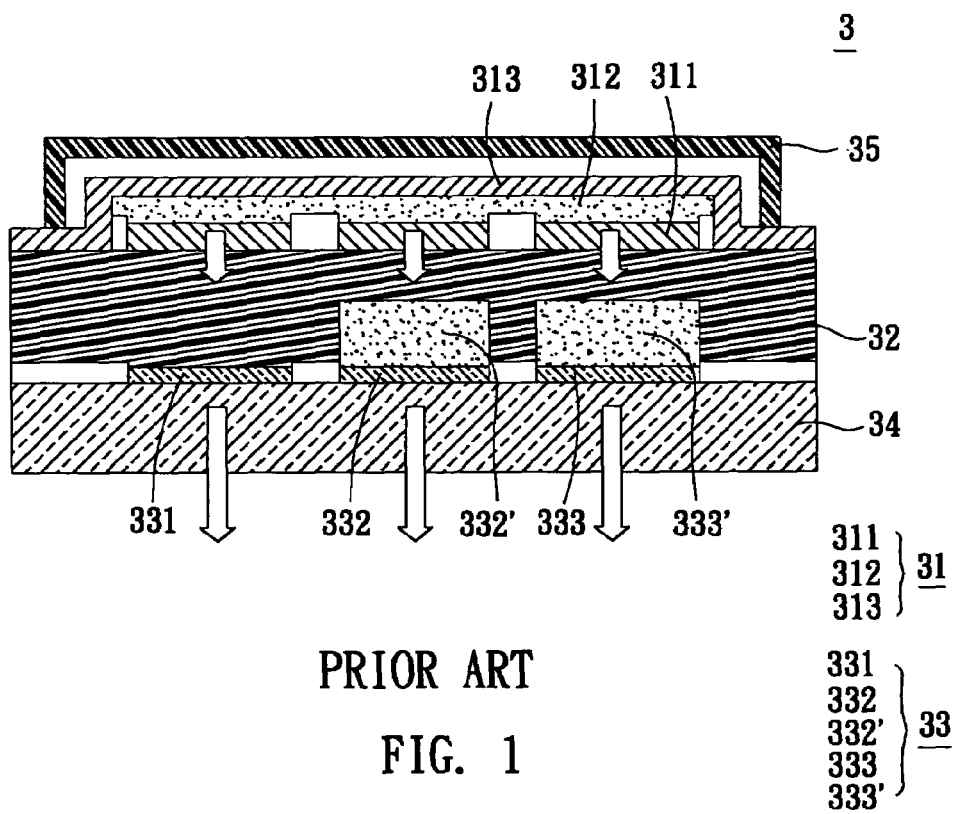
FIG. 1 is a schematic view showing the conventional full color display panel.
Figure 2:
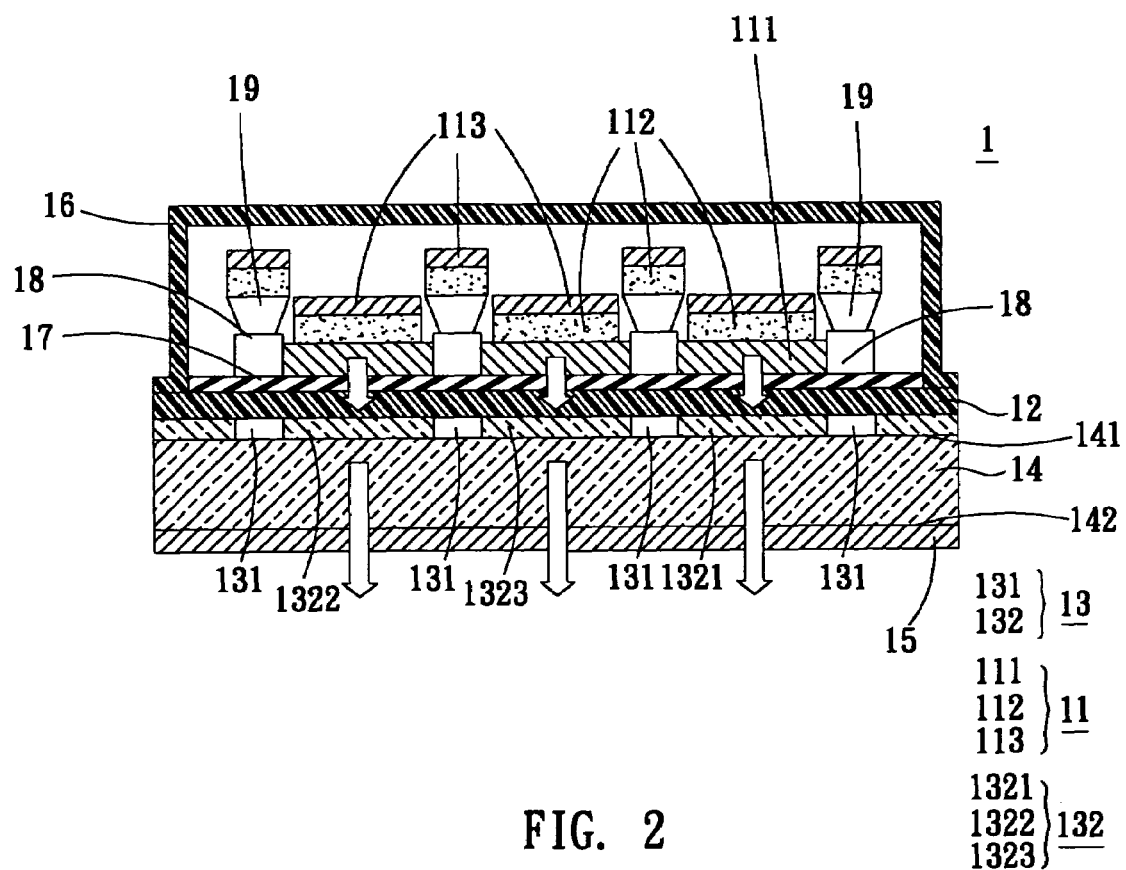
FIG. 2 is a schematic view showing a full color display panel with a mirror function according to a first embodiment of the invention.

With reference to FIG. 2, a full color display panel with a mirror function 1 according to the first embodiment of the invention comprises an organic light-emitting area 11, a spectrum-modulation layer 12, a color-separating layer 13 a transparent substrate 14, and a semi-reflecting layer 15. In this embodiment, the organic light-emitting area 11 comprises a plurality of pixels for emitting white light. The spectrum-modulation layer 12 comprises a protecting medium, which is transparent and is doped with a fluorescent material and/or a phosphorescent material. The color-separating layer 13 comprises a light-shielding frame 131 and a plurality of color filters 132. The light-shielding frame 131 is disposed around the peripheral of the color filters 132. The transparent substrate 14 has a first surface 141 and a second surface 142 opposite to the first surface 141. The color-separating layer 13 is disposed above the first surface 141 of the transparent substrate 14. The spectrum-modulation layer 12 is disposed above the color-separating layer 13. The organic light-emitting area 11 is disposed above the spectrum-modulation layer 12. The semi-reflecting layer 15 is sandwiched between the first surface 141 of the transparent substrate 14 and the color-separating layer 13 or is disposed on the second surface 142 of the transparent substrate 14.

As shown in FIG. 2, the organic light-emitting area 11 comprises a plurality of pixels for emitting white light. The pixel comprises a first electrode 111, an organic functional layer 112, and a second electrode 113. The first electrode 111 is disposed above the spectrum-modulation layer 12. The second electrode 113 is disposed above the first electrode 111, and the organic functional layer 112 is sandwiched between the first electrode 111 and the second electrode 113.

In such a case, the first electrode 111 is formed above the spectrum-modulation layer 12 by a sputtering method or an ion plating method. The first electrode 111 is usually used as an anode and made of a transparent conductive metal oxide, such as indium-tin oxide (ITO), aluminum-zinc oxide (AZO), or indium-zinc oxide (IZO).

The organic functional layer 112 in the current embodiment is disposed on the first electrode 111. The organic functional layer 112 usually may contain a hole injection layer, a hole transporting layer, an electroluminescent layer, an electron transporting layer, and an electron injection layer (not shown). The hole injection layer comprises copper phthalocyanine (CuPc), the hole transporting layer comprises 4,4'-bis[N-(1-naphthyl)-N-phenylamino]biphenyl (NPB), the electron injection layer comprises lithium fluoride (LiF), and the electron transporting layer comprises tris(8-quinolinato-N1,08)-aluminum (Alq). Each layer of the organic functional layer 112 may be formed upon the first electrode by utilizing evaporation, spin coating, ink jet printing, or printing. In addition, the light emitted from the organic functional layer 112 is broadband white light. This may be carried out by mixing electroluminescent materials with complementary colors such as orange and blue. Of course, other electroluminescent materials with complementary colors could be used.

The second electrode 113 is disposed on the organic functional layer 112. Herein, the second electrode 113 is formed on the organic functional layer 112 by way of evaporation or sputtering. The material of the second electrode 113 can be aluminum, calcium, and magnesium-silver alloys. Of course, the material of the second electrode 113 can also be aluminum/lithium fluoride or silver.

Please refer to FIG. 2 again. The spectrum-modulation layer 12 is disposed above the color-separating layer 13, and comprises a protecting medium, which is transparent and is doped with a fluorescent material and/or a phosphorescent material. The fluorescent material and/or the phosphorescent material of the spectrum-modulation layer 12 can mix, scatter and excite the light, so as to enhance the luminescent efficiency, and to improve the purity of white light emitted from the organic light-emitting area 11. Therefore, the white light with uniform and broadband radiation spectrum can be obtained. Furthermore, the demands of the color display panel can be satisfied. Moreover, the spectrum-modulation layer 12 is a planar structure with a single layer, which can also provide a planarization effect.

In this embodiment, the material of the protecting medium can be selected from but not limited to the group consisting of Polymethyl methacrylate (PMMA), tetrafluoroethylene resin, silicon resin, and silicon dioxide.

The protecting medium can be used to protect the first electrode 111 and the second electrode 113. Since the protecting medium is adhesive, it can be used to attach with a cover plate 16. In other words, it is unnecessary to apply a sealing glue, and the encapsulation process can still be performed. In addition, the protecting medium is waterproof. The protecting medium can combine with the cover plate 16 or the passivation layer of the organic light-emitting area 11 (not shown) to form an encapsulation. Thus, the organic light-emitting area 11 can be prevented from water or oxygen.

In the current embodiment, the fluorescent material can be produced by mixing red fluorescent powder, green fluorescent powder, and/or blue fluorescent powder. The phosphorescent material can be produced by mixing red phosphorescent powder, green phosphorescent powder, and/or blue phosphorescent powder.

As mentioned above, the fluorescent material may includes more than one organic dyes or more than one inorganic dyes. Herein, the red fluorescent powder may be an azo dye (organic dye) or $Y_2O_2S:Eu^{3+}$, $Bi^{3+}$ (inorganic dye). The green fluorescent powder may be a CuPc dye (organic dye) or $SrGa_2O_4:Eu^{2+}$ (inorganic dye). The blue fluorescent powder may be a cyanine dye (organic dye) or $SrGa_2S_4:Eu^{2+}$ (inorganic dye). In this embodiment, the fluorescent material may be nano sized powder.

In addition, the phosphorescent material may include more than one organic dye or more than one inorganic dye. In the embodiment, the red phosphorescent powder may be 2,3,7,8,12,13,17,18-octaethyl-12H,23H-porphine platinum (II) [PtOEP] or Tris-(4,4,4-trifluoro-1-(2-thienyl)-1,3-butanediono)-1,10-phenanthroline europium(III) [Eu(TTA) 3phen]. The green phosphorescent powder may be Bis(2-phenyl-pyridinato-N,C2)iridium(acetylacetone) [ppy2Ir (acac)] or Iridium(III) bis(tolypyridine)salicyclidene [tpyIrsd]. The blue phosphorescent powder may be Iridium-bis(4,6-di-fluorophenyl-pyridinato-N,C2)-picolinate [Firpic] or Bis[(4,6-difluorophenyl-pyridinato-N,C2)iridium (acetylacetone) [Fir(acac)]. In this embodiment, the phosphorescent material may be nano sized powder.

Figure 3:
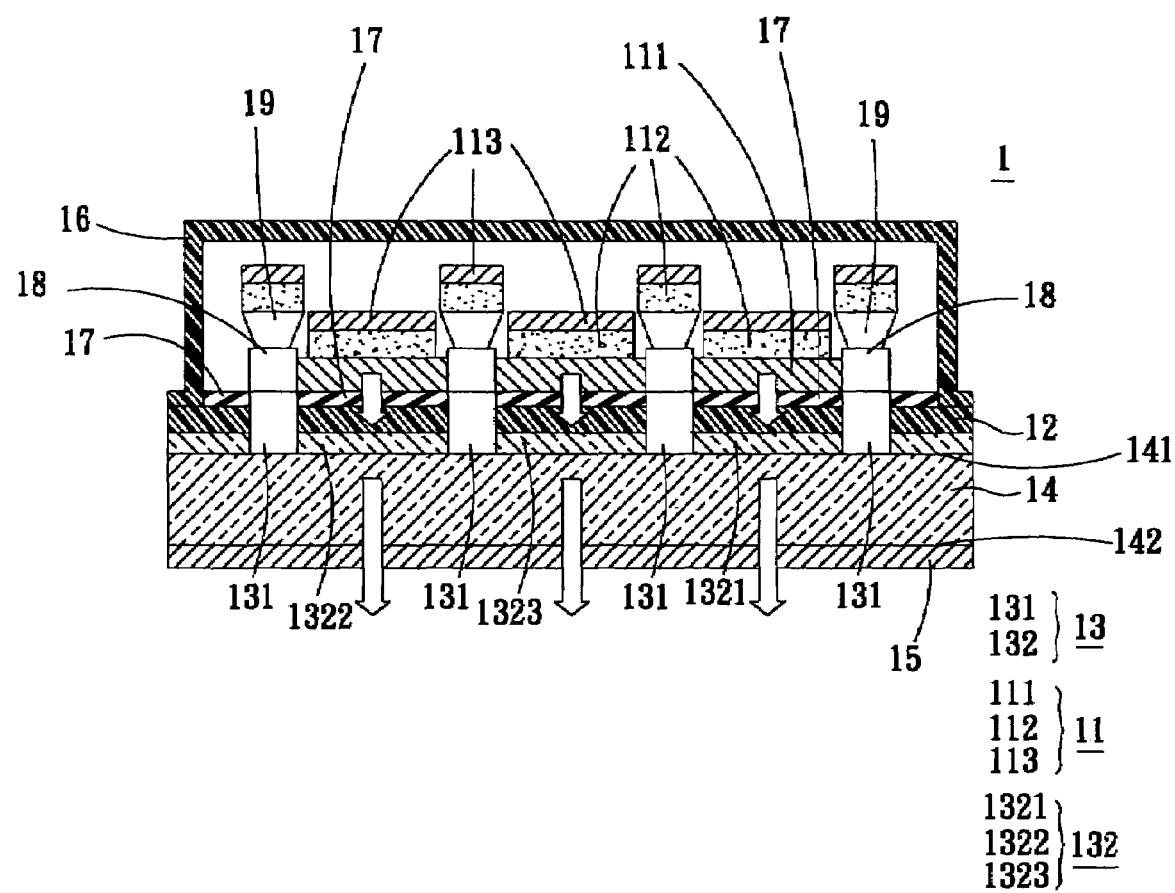
FIG. 3 is a schematic view showing another full color display panel with a mirror function according to the first embodiment of the invention.

Referring to FIG. 2, the color-separating layer 13 comprises a plurality of color filters 132 surrounded with a light-shielding frame 131. Herein, the light-shielding frame 131 is a black frame, which can avoid the mixing of lights of various colors. Of course, the light-shielding frame 131 can be made of reflective metal for controlling the direction of the light and increasing the utilization and uniformity of light. In addition, the light-shielding frame 131 is protruded out of the spectrum-modulation layer 12 (as shown in FIG. 3).

The color filters 132 comprise at least one red filter 1321, at least one blue filter 1322, and at least one green filter 1323. In the current embodiment, the high purity white light produced by the spectrum-modulation layer 12 respectively passes the red filters 1321, the blue filters 1322 and the green filters 1323, so as to generate red light, blue light and green light.

Please refer to FIG. 2 again. The transparent substrate 14 of the embodiment can be a flexible or rigid substrate. The transparent substrate 14 can also be a plastic or glass substrate. In particular, the flexible substrate or plastic substrate can be made of polycarbonate (PC), polyester (PET), cyclic olefin copolymer (COC), or metallocene-based cyclic olefin copolymer (mCOC).

Figure 5:
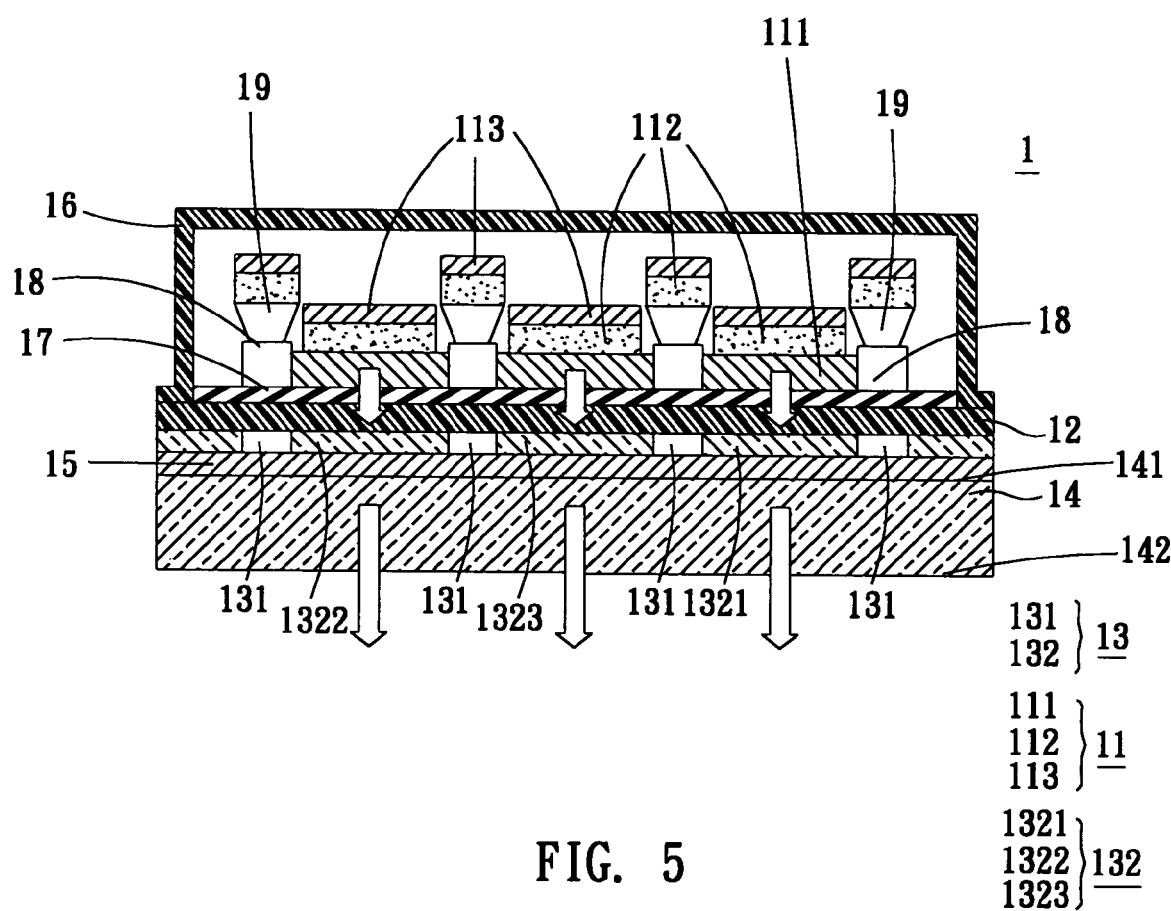
FIG. 5 is a schematic view showing yet another full color display panel with a mirror function according to the first embodiment of the invention.

In this embodiment, the semi-reflecting layer 15 is disposed on the second surface 142 of the transparent substrate 14, as shown in FIG. 2. Alternatively, the semi-reflecting layer 15 can be disposed between the first surface 141 of the transparent substrate 14 and the color-separating layer 13 (as shown in FIG. 5). Moreover, the semi-reflecting layer 15 can be disposed on other side surfaces (not shown) of the transparent substrate 14 to increase the lateral light utilization of the full color display panel 1.

In such a case, the semi-reflecting layer 15 is formed between the first surface 141 of the transparent substrate 14 and the color-separating layer 13 or on the second surface 142 by way of evaporation, sputtering, or ion plating. In the current embodiment, the semi-reflecting layer 15 is made of a metal or a dielectric material. The radiation transmittance of the semi-reflecting layer 15 is approximately between 10% and 90%.

As shown in FIG. 2, the full color display panel 1 of the embodiment may further comprise an insulating layer 17, which is disposed between the spectrum-modulation layer 12 and the organic light-emitting area 11. Thus, the insulating layer 17 can prevent the substantially contact, which leads to short circuit. Herein, the insulating layer 17 is transparent and can be made of an organic compound or inorganic compound.

In addition, the full color display panel 1 of the embodiment may further comprise a pixel defining layer 18. The pixel defining layer 18 is disposed at the periphery of the first electrode 111 and/or the transparent substrate 14 to define pixels within the organic light-emitting area 11. The pixel defining layer 18 may be black to shield or reflect light. This could avoid mixing of the light emitted from the pixels, control the direction of the light, and increase the utilization and uniformity of light. In the embodiment, the light-shielding frame 131 protruded from the spectrum-modulation layer 12 may connect to the pixel defining layer 18 (as shown in FIG. 3).

The full color display panel 1 of the embodiment may further comprise a separating layer 19, which is disposed on the pixel defining layer 18. The separating layer 19 can separate each pixel of the organic light-emitting area 11. In this case, the separating layer 19 is made of an insulating material and has a top width larger than a bottom width thereof.

Figure 4:
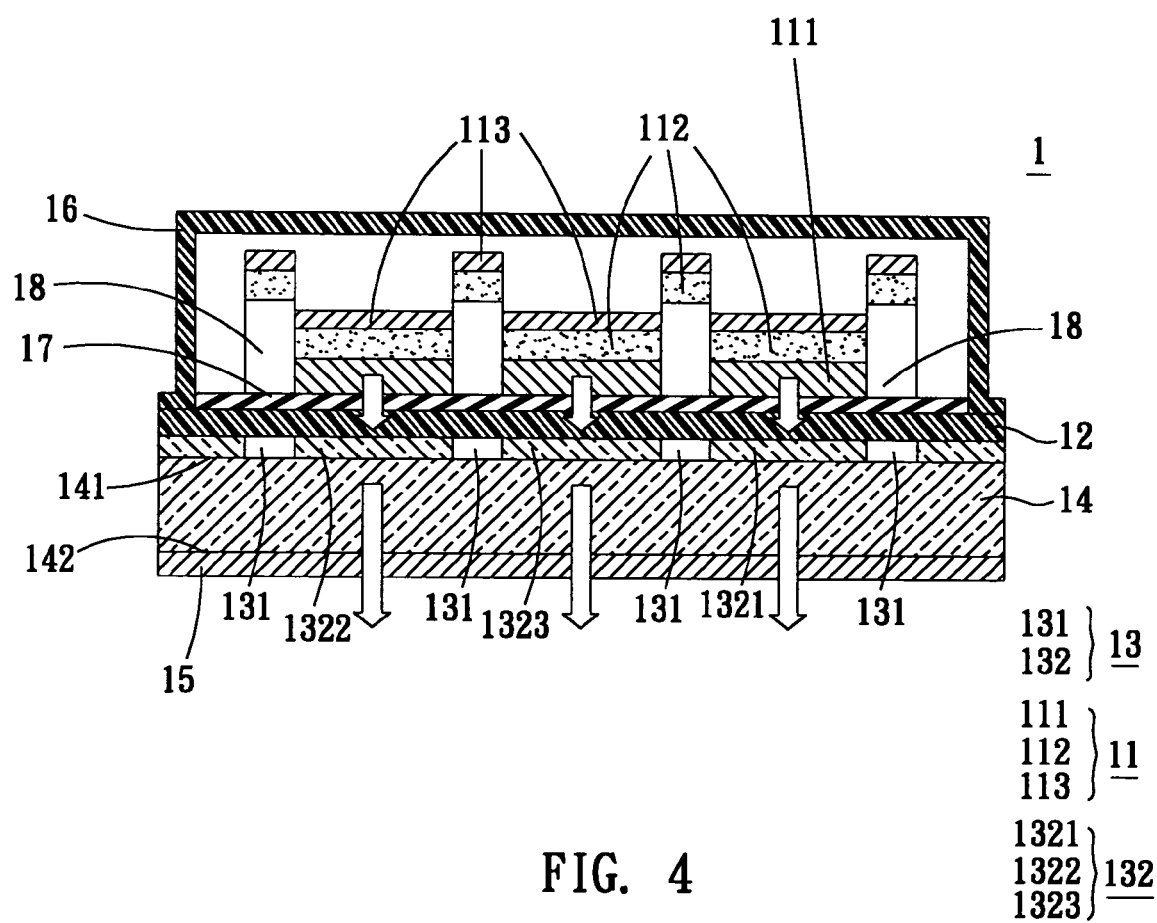
FIG. 4 is a schematic view showing an additional full color display panel with a mirror function according to the first embodiment of the invention.

In general, the separating layer 19 is provided in a passive matrix full color display panel, such as a PMOLED, to separate the cathodes of the pixels for simplifying manufacturing processes. In addition, an active matrix full color display panel, such as an AMOLED, has thin-film transistors (TFT) for controlling the pixels, so the separating layer 19 is unnecessary (as shown in FIG. 4).

Moreover, the full color display panel 1 of the embodiment may further comprise a driving circuit (not shown). The driving circuit can be an active driving circuit or a passive driving circuit. The driving circuit is connected to the organic light-emitting area 11 and a power source (not shown).

Figure 6:
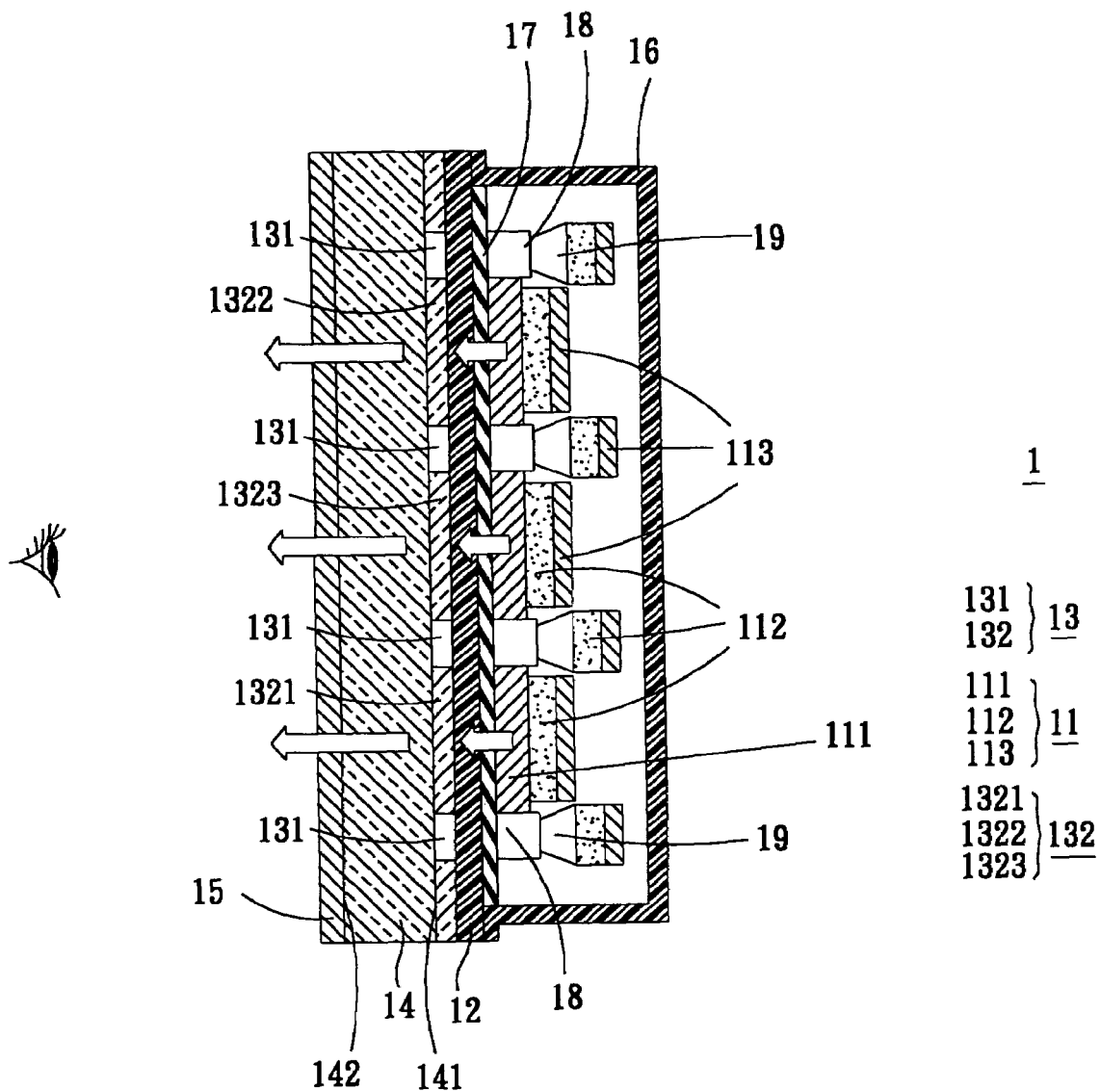
FIG. 6 is a schematic view showing an application of the full color display panel illustrated in FIG. 2.

FIG. 6 is a schematic view showing the application of that shown in FIG. 2. According to the invention, the user sees the screen (such as text, numbers, pictures or images) shown by the full color display panel 1 when the display panel 1 emits light or radiation. On the other hand, when the full color display panel 1 does not emit light, the user sees reflection from the screen.

As another example, if one uses the full color display panel with a mirror function 1 as a TV inside a room, it can also be used as a mirror. This does not only save the user money for purchasing a mirror and space for decorating the mirror, but the room design can also be made better. Since the OEL display panel does not have the limitation of viewing angles, this advantage further increases the practical applications of the invention.

Figure 7:
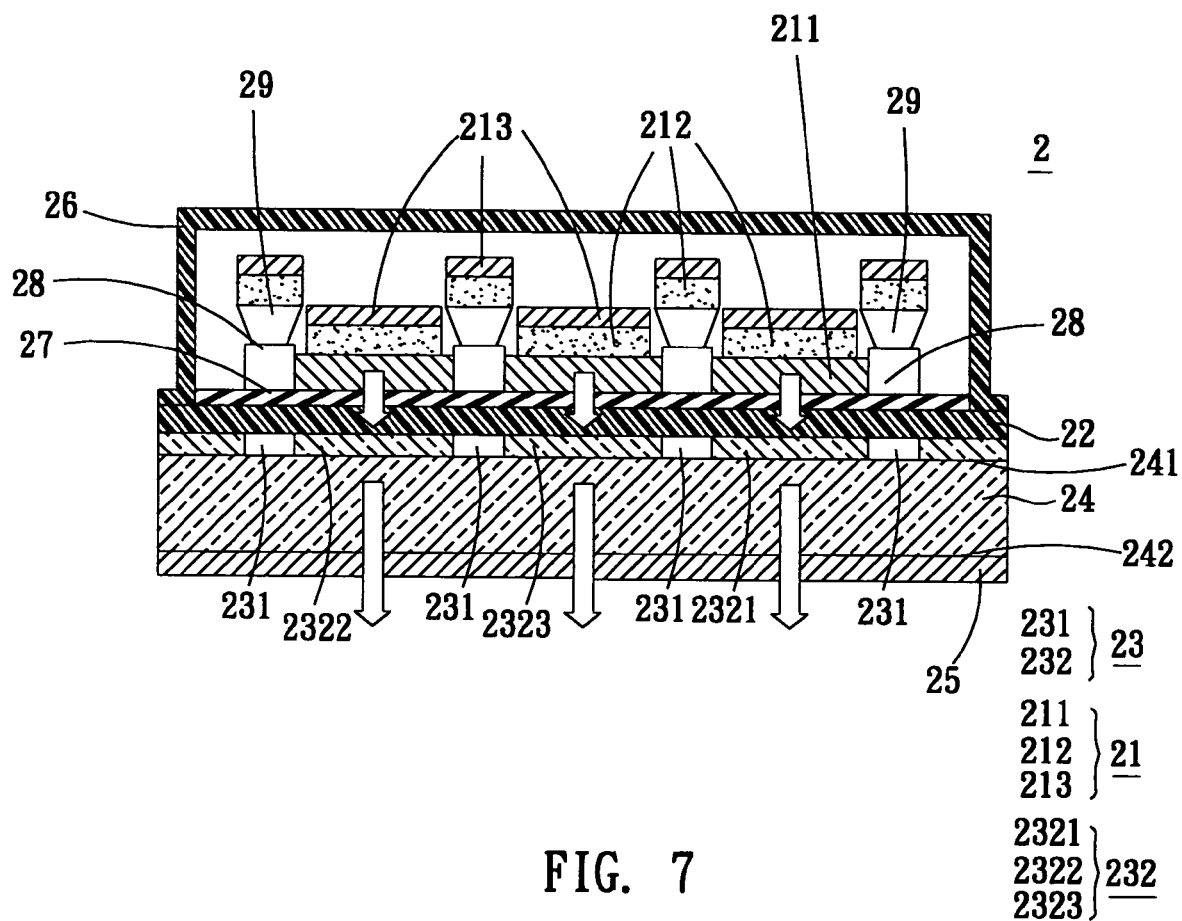
FIG. 7 is a schematic view showing a full color display panel with a mirror function according to a second embodiment of the invention.

With reference to FIG. 7, a full color display panel 2 according to the second embodiment of the invention comprises an organic light-emitting area 21, a spectrum-modulation layer 22, a color-separating layer 23, a transparent substrate 24, and a transparent substrate 25. In this embodiment, the organic light-emitting area 21 comprises a plurality of pixels for emitting short wavelength light. The spectrum-modulation layer 22 comprises a protecting medium, which is transparent and is doped with a fluorescent material and/or a phosphorescent material. The color-separating layer 23 comprises a light-shielding frame 231 and a plurality of color filters 232. The light-shielding frame 231 is disposed around the peripheral of the color filters 232. The transparent substrate 24 has a first surface 241 and a second surface 242 opposite to the first surface 241. The color-separating layer 23 is disposed above the first surface 241 of the transparent substrate 24. The spectrum-modulation layer 22 is disposed above the color-separating layer 23. The organic light-emitting area 21 is disposed above the spectrum-modulation layer 22. The semi-reflecting layer 25 is sandwiched between the first surface 241 of the transparent substrate 24 and the color-separating layer 23 or is disposed on the second surface 242 of the transparent substrate 24.

The features and functions of the color-separating layer 23, the light-shielding frame 231, the color filters 232 (comprising at least one red filter 2321, at least one blue filter 2322, and at least one green filter 2323), the transparent substrate 24, and the semi-reflecting layer 25 in the second embodiment are the same as those in the first embodiment, they are not repeatedly described hereinafter.

With reference to FIG. 7, the organic light-emitting area 21 comprises a plurality of pixels for emitting short wavelength light. The pixel comprises a first electrode 211, an organic functional layer 212, and a second electrode 213. The first electrode 211 is disposed above the spectrum-modulation layer 22. The second electrode 213 is disposed above the first electrode 211, and the organic functional layer 212 is sandwiched between the first electrode 211 and the second electrode 213.

The features and functions of the first electrode 211 and the second electrode 213 in the second embodiment are the same as the first electrode 111 and the second electrode 113 in the first embodiment, they are not repeatedly described hereinafter.

In this embodiment, the light emitted from the organic functional layer 212 is short wavelength light such as ultraviolet light or blue light. Besides, the structures and functions of the organic functional layer 212 in the second embodiment are the same as the organic functional layer 112 in the first embodiment, they are not repeatedly described hereinafter.

Moreover, the spectrum-modulation layer 22 is disposed above the color-separating layer 23, and comprises a protecting medium, which is transparent and is doped with a fluorescent material and/or a phosphorescent material. The fluorescent material and/or the phosphorescent material of the spectrum-modulation layer 22 can mix, scatter and excite light, so as to translate the short wavelength light (ultraviolet light or blue light) emitted from the organic light-emitting area 21 into white light. Thus, the invention can enhance the luminescent efficiency of the organic light-emitting area 21. Therefore, the white light with uniform and broadband radiation spectrum can be obtained. Furthermore, the demands of the full color display panel can be satisfied. Moreover, the spectrum-modulation layer 22 is a planar structure with a single layer, which can also provide a planarization effect.

In this embodiment, the material of the protecting medium can be selected from but not limited to the group consisting of Polymethyl methacrylate (PMMA), tetrafluoroethylene resin, silicon resin, and silicon dioxide.

The protecting medium can be used to protect the first electrode 211 and the second electrode 213. Since the protecting medium is adhesive, it can be used to attach with a cover plate 26. In other words, it is unnecessary to apply a sealing glue, and the encapsulation process can still be performed. In addition, the protecting medium is waterproof. The protecting medium can combine with the cover plate 26 or the passivation layer of the organic light-emitting area 21 (not shown) to form an encapsulation. Thus, the organic light-emitting area 21 can be prevented from water or oxygen.

In the current embodiment, the fluorescent material can be produced by mixing red fluorescent powder, green fluorescent powder, and/or blue fluorescent powder. The phosphorescent material can be produced by mixing red phosphorescent powder, green phosphorescent powder, and/or blue phosphorescent powder.

As mentioned above, the fluorescent material may include more than one organic dyes or more than one inorganic dyes. Herein, the red fluorescent powder may be an azo dye (organic dye) or $Y_2O_2S:Eu^{3+}$, $Bi^{3+}$ (inorganic dye). The green fluorescent powder may be a CuPc dye (organic dye) or $SrGa_2O_4:Eu^{2+}$ (inorganic dye). The blue fluorescent powder may be a cyanine dye (organic dye) or $SrGa_2S_4:Eu^{2+}$ (inorganic dye). In this embodiment, the fluorescent material may be nano sized powder.

In addition, the phosphorescent material may include more than one organic dye or more than one inorganic dye. In the embodiment, the red phosphorescent powder may be 2,3,7,8,12,13,17,18-octaethyl-12H,23H-porphine platinum (II) [PtOEP] or Tris-(4,4,4-trifluoro-1-(2-thienyl)-1,3-butanediono)-1,10-phenanthroline europium(III) [Eu(TTA)

3phen]. The green phosphorescent powder may be Bis(2-phenyl-pyridinato-N,C2)iridium(acetylacetone) [ppy2Ir(acac)] or Iridium(III) bis(tolypyridine)salicyclidene [tpyIrsd]. The blue phosphorescent powder may be Iridium-bis(4,6-di-fluorophenyl-pyridinato-N,C2)-picolinate [Firpic] or Bis[(4,6-difluorophenyl-pyridinato-N,C2)iridium (acetylacetone) [Fir(acac)]. In this embodiment, the phosphorescent material may be nano sized powder.

The full color display panel 2 of the embodiment may further comprise an insulating layer 27, a pixel defining layer 28, and a separating layer 29, wherein the features and functions of the insulating layer 27, pixel defining layer 28, and separating layer 29 in the second embodiment are the same as those in the first embodiment, so they are not repeatedly described hereinafter.

To sum up, the full color display panel with a mirror function of the invention has a spectrum-modulation layer, which is used to improve the purity of white light emitted from the organic light-emitting area or to translate the short wavelength ultraviolet or blue light emitted from the organic light-emitting area into white light, so as to enhance the luminescent efficiency of the organic light-emitting area. Therefore, the white light with uniform and broadband radiation spectrum can be obtained, and satisfy the application of full color displays. Comparing with the conventional art, since the planarization layer is unnecessary in the invention, the structure of the full color display panel of the invention is simplified. At the meanwhile, the thickness of the panel of the invention is reduced. In addition, since it is unnecessary to perform the photolithography processes to form the color conversion films of three primary colors (R, G, B), the manufacturing processes of the color display panel are simplified and the cost thereof is decreased. Moreover, the manufacturing yield is increased. Furthermore, since it is not to be restricted by the areas of the color conversion films, the viewing angle of the panel can be increased. In addition, the full color display panel with a mirror function of invention has a semi-reflecting layer for performing mirror effects. When the organic light-emitting area emits light, the display panel of the invention exhibits its display function. On the other hand, when the organic light-emitting area does not emit light, the display panel of the invention exhibits the mirror function. The invention integrates the semi-reflecting layer in the planar structure of the full color display panel so that the full color display panel of the invention has the dual functions of displaying and reflecting images. This does not only broaden the application scope of the full color display panel, but also makes the operations much easier for users. Since the semi-reflecting layer is disposed inside the full color display panel, the manufacturing process is simpler and cheaper. Therefore, the invention is suitable for mass production.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A full color display panel with a mirror function, comprising:
    an organic light-emitting area, which comprises a plurality of pixels for emitting white light;
    a spectrum-modulation layer, which comprises a transparent protecting medium doped with a fluorescent material and/or a phosphorescent material;
    a color-separating layer, which comprises a plurality of color filters surrounded with a light-shielding frame;
    a transparent substrate, which has a first surface and a second surface opposite to the first surface, wherein the color-separating layer is disposed above the first surface of the transparent substrate, the spectrum-modulation layer is disposed above the color-separating layer, and the organic light-emitting area is disposed above the spectrum-modulation layer; and
    a semi-reflecting layer, which is disposed on the second surface of the transparent substrate or between the first surface of the transparent substrate and the color-separating layer.

2. The full color display panel of claim 1, further comprising:
    an insulating layer, which is disposed between the spectrum-modulation layer and the organic light-emitting area.

3. The full color display panel of claim 1, wherein the pixel comprises a first electrode, an organic functional layer, and a second electrode, the first electrode is disposed above the spectrum-modulation layer, the second electrode is disposed above the first electrode, and the organic functional layer is disposed between the first electrode and the second electrode.

4. The full color display panel of claim 1, further comprising:
    a pixel defining layer, which is disposed on the first electrode and/or the transparent substrate to define pixels within the organic light-emitting area.

5. The full color display panel of claim 1, wherein the color filters are provided corresponding to the pixels of the organic light-emitting area.

6. The full color display panel of claim 1, wherein the material of the protecting medium is at least one selected from the group consisting of polymethyl methacrylate, tetrafluoroethylene resin, silicon resin, and silicon dioxide.

7. The full color display panel of claim 1, wherein the fluorescent material is mixed with red fluorescent powder, green fluorescent powder, and/or blue fluorescent powder, and the phosphorescent material is mixed with red phosphorescent powder, green phosphorescent powder, and/or blue phosphorescent powder.

8. The full color display panel of claim 1, wherein the color filters comprise at least one red filter, at least one blue filter, and at least one green filter.

9. The full color display panel of claim 1, wherein the material of the semi-reflecting layer comprises a metal or a dielectric material.

10. The full color display panel of claim 1, wherein the semi-reflecting layer has a radiation transmittance between about 10% and 90%.

11. A full color display panel with a mirror function, comprising:
    an organic light-emitting area, which comprises a plurality of pixels for emitting short wavelength light;
    a spectrum-modulation layer, which comprises a transparent protecting medium doped with a fluorescent material and/or a phosphorescent material;
    a color-separating layer, which comprises a plurality of color filters surrounded with a light-shielding frame;
    a transparent substrate, which has a first surface and a second surface opposite to the first surface, wherein the color-separating layer is disposed above the first surface of the transparent substrate, the spectrum-modulation layer is disposed above the color-separating layer, and the organic light-emitting area is disposed above the spectrum-modulation layer; and a semi-reflecting layer, which is disposed on the second surface of the transparent substrate or between the first surface of the transparent substrate and the color-separating layer.

12. The full color display panel of claim 11, wherein the short wavelength light emitted from the pixels of the organic light-emitting area is ultraviolet light or blue light.

13. The full color display panel of claim 11, wherein the pixel comprises a first electrode, an organic functional layer, and a second electrode, the first electrode is disposed above the spectrum-modulation layer, the second electrode is disposed above the first electrode, and the organic functional layer is disposed between the first electrode and the second electrode.

14. The full color display panel of claim 11, further comprising:

a pixel defining layer, which is disposed on the first electrode and/or the transparent substrate to define pixels within the organic light-emitting area.

15. The full color display panel of claim 11, wherein the material of the protecting medium is at least one selected from the group consisting of polymethyl methacrylate, tetrafluoroethylene resin, silicon resin, and silicon dioxide.

16. The full color display panel of claim 11, wherein the protecting medium is adhesive or waterproof for attaching with a cover plate.

17. The full color display panel of claim 11, wherein the fluorescent material is mixed with red fluorescent powder, green fluorescent powder, and/or blue fluorescent powder, and the phosphorescent material is mixed with red phosphorescent powder, green phosphorescent powder, and/or blue phosphorescent powder.

18. The full color display panel of claim 11, wherein the color filters comprise at least one red filter, at least one blue filter, and at least one green filter.

19. The full color display panel of claim 11, wherein the material of the semi-reflecting layer comprises a metal or a dielectric material.

20. The full color display panel of claim 11, wherein the semi-reflecting layer has a radiation transmittance between about 10% and 90%.

* * * * *